United States Patent
Liang et al.

(10) Patent No.: US 10,739,854 B2
(45) Date of Patent: Aug. 11, 2020

(54) TERMINAL AND TOUCH RESPONSE METHOD AND DEVICE

(71) Applicant: Beijing Xiaomi Mobile Software Co., Ltd., Haidian District, Beijing (CN)

(72) Inventors: Zhe Liang, Beijing (CN); Yin Zhu, Beijing (CN); Zhenzhou Lu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 39 days.

(21) Appl. No.: 15/658,399

(22) Filed: Jul. 25, 2017

(65) Prior Publication Data
US 2018/0039332 A1    Feb. 8, 2018

(30) Foreign Application Priority Data
Aug. 8, 2016 (WO) ................ PCT/CN2016/094033

(51) Int. Cl.
| | | |
|---|---|---|
| G06F 3/01 | (2006.01) | |
| G06F 3/041 | (2006.01) | |
| H03K 17/96 | (2006.01) | |
| G06K 9/00 | (2006.01) | |
| H04M 1/725 | (2006.01) | |

(52) U.S. Cl.
CPC ............ G06F 3/016 (2013.01); G06F 3/0414 (2013.01); H03K 17/9625 (2013.01); G06K 9/00013 (2013.01); H03K 2217/96062 (2013.01); H04M 1/72519 (2013.01)

(58) Field of Classification Search
CPC .......... G06F 3/014; G06F 3/016; G06F 3/044; G06K 9/00013

USPC .................................................. 345/173, 174
See application file for complete search history.

(56) References Cited

U.S. PATENT DOCUMENTS

| | | | |
|---|---|---|---|
| 8,786,548 B2* | 7/2014 | Oh .......................... | H04M 1/22 345/158 |
| 9,916,078 B2* | 3/2018 | Kim ...................... | H04M 1/236 |
| 2009/0267906 A1 | 10/2009 | Schroderus | |
| 2010/0027854 A1 | 2/2010 | Chatterjee | |

(Continued)

FOREIGN PATENT DOCUMENTS

| | | |
|---|---|---|
| CN | 102016769 A | 4/2011 |
| CN | 102498459 A | 6/2012 |

(Continued)

OTHER PUBLICATIONS

Benjamin Mayo, "Purported iPhone 7 photos claims to show new touch-sensitive Home Button I 9to5Mac", Jun. 15, 2016, XP055429477, Retrieved from the Internet: URL:https://9to5mac.com/2016/06/15/purported-iphone-7-photos-claims-to-show-new-touch-sensitive-home-button/ [retrieved on Nov. 28, 2017].

(Continued)

*Primary Examiner* — Calvin C Ma
(74) *Attorney, Agent, or Firm* — Jun He Law Offices P.C.; James J. Zhu

(57) ABSTRACT

A terminal and a touch response method and device are provided. The terminal includes: a screen cover plate comprising a display area part and a key area portion, a touch key is formed in the key area portion; a touch sensor arranged below the touch key; a pressure sensor arranged below the touch key; and a processing chip electrically connected with the touch sensor and the pressure sensor respectively.

14 Claims, 9 Drawing Sheets

(56) References Cited

U.S. PATENT DOCUMENTS

| | | | |
|---|---|---|---|
| 2011/0241850 A1 | 10/2011 | Bosch et al. | |
| 2012/0039023 A1 | 2/2012 | Renwick | |
| 2012/0162114 A1* | 6/2012 | Inoue | G06F 3/016 345/173 |
| 2013/0018489 A1* | 1/2013 | Grunthaner | G06F 3/041 700/73 |
| 2013/0307818 A1* | 11/2013 | Pope | G06F 3/044 345/174 |
| 2014/0216914 A1 | 8/2014 | Pope et al. | |
| 2015/0135108 A1* | 5/2015 | Pope | G06K 9/00006 715/767 |
| 2015/0242675 A1 | 8/2015 | Pope et al. | |
| 2016/0004896 A1 | 1/2016 | Pope et al. | |
| 2016/0195992 A1 | 7/2016 | Jiang et al. | |
| 2016/0267313 A1 | 9/2016 | Pope et al. | |
| 2017/0109565 A1 | 4/2017 | Pope et al. | |
| 2018/0035923 A1* | 2/2018 | Kang | A61B 5/117 |

FOREIGN PATENT DOCUMENTS

| | | |
|---|---|---|
| CN | 102882501 A | 1/2013 |
| CN | 103097980 A | 5/2013 |
| CN | 104571709 A | 4/2015 |
| CN | 104932828 A | 9/2015 |
| CN | 105045422 A | 11/2015 |
| CN | 105389102 A | 3/2016 |
| CN | 105404423 A | 3/2016 |
| EP | 2472366 A1 | 7/2012 |
| EP | 2546730 A2 | 1/2013 |

OTHER PUBLICATIONS

Adam Westlake, "iPhone 7 with touch-sensitive Home Button shown in photo leak-SlashGear", Jun. 15, 2016, XP055429490, Retrieved from the Internet: URL: https://www.slashgear.com/iphone-7-with-touch-sensitive-home-button- shown-in-photo-leak-15444383/ [retrieved on Nov. 28, 2017].

International Search Report in international application No. PCT/CN2016/094033, dated May 17, 2017.

Written Opinion of the International Search Authority in international application No. PCT/CN2016/094033, dated May 17, 2017.

Supplementary European Search Report in European application No. 17179947.1, dated Dec. 6, 2017.

Real Touch Screen adapted from Selected Chinese Science Literature in 2012/YOU Shiyou Shi Jun Selected, published on Jan. 31, 2013, p. 308-311.

Capacitive Pressure Sensor adapted from Testing Technology and Instrumentation / FAN Chunling Editor-in-Beijing: Mechanical Industry Press, published on Jan. 31, 2014, p. 40-45.

First Office Action of the Chinese application No. 201680000705.0, dated Sep. 5, 2018.

English translation of the Written Opinion of the International Search Authority of PCT application No. PCT/CN2016/094033, dated May 17, 2017.

The Office Action of European Patent Application No. 17179947.1, dated Jan. 29, 2020.

* cited by examiner

US 10,739,854 B2

TERMINAL AND TOUCH RESPONSE METHOD AND DEVICE

CROSS-REFERENCE TO RELATED APPLICATIONS

This application is filed based upon and claims priority to International Patent Application PCT/CN2016/094033, filed on Aug. 8, 2016, the entire contents of which are incorporated herein by reference.

TECHNICAL FIELD

The present disclosure relates to touch technology, and more particularly, to a terminal and a touch response method and device.

BACKGROUND

Along with development of mobile device technology, smart phones are continuously popularized, and play a more and more important role in daily lives of people.

At present, a smart phone usually adopts a design with three virtual keys (i.e. touch keys), and the three virtual keys are arranged below a display area of the smart phone, wherein each of the virtual keys is configured to realize different functions. For example, the three virtual keys are configured to realize functions of returning to a previous page, returning to a desktop menu page and switching a task, respectively. When a user touches a virtual key, the smart phone acquires a corresponding operation signal, and realizes the corresponding function according to the key on which the operation signal acts.

SUMMARY

The embodiments of the present disclosure provide a terminal and a touch response method and device.

According to a first aspect of the embodiments of the present disclosure, a terminal is provided. The terminal includes: a screen cover plate comprising a display area part and a key area portion, a touch key being formed in the key area portion; a touch sensor arranged below the touch key; a pressure sensor arranged below the touch key; and a processing chip electrically connected with the touch sensor and the pressure sensor respectively.

According to a second aspect of the embodiments of the present disclosure, a touch response method is provided. The method is applied to a terminal and the terminal includes a touch key and a processing chip. The method includes: acquiring a touch operation acting on the touch key; determining, by the processing chip, an operation type corresponding to the touch operation; and executing an operation corresponding to the operation type.

According to a third aspect of the embodiments of the present disclosure, a touch response device is provided, and the device is applied to a terminal. The terminal includes a touch key. The device includes a processor; and a memory configured to store instructions executable by the processor, wherein the processor is configured to: acquire a touch operation acting on the touch key; determine an operation type corresponding to the touch operation; and execute an operation corresponding to the operation type.

It should be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the specification, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with some aspects related to the present disclosure as recited in the appended claims.

Figure 1A:
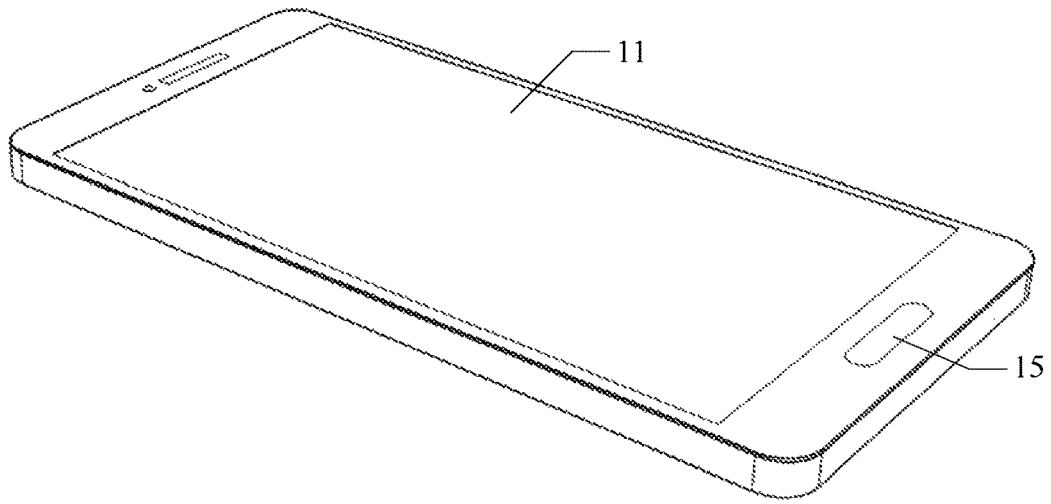
FIG. 1A is an overall structure diagram of a terminal, according to an exemplary embodiment.
Figure 1B:
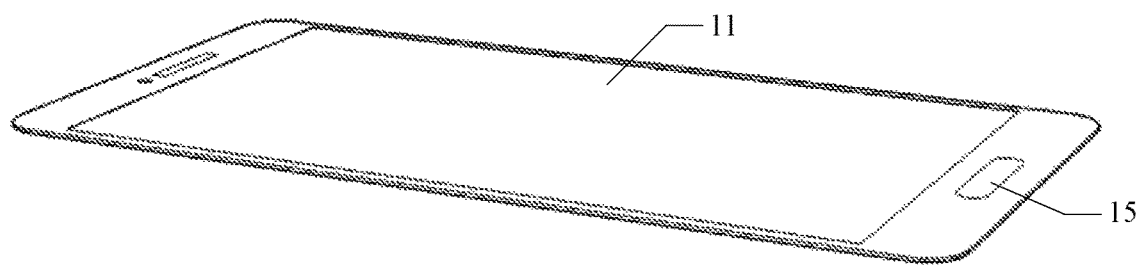
FIG. 1B is a perspective structure diagram of a terminal, according to an exemplary embodiment.
Figure 1B:
Figure 1B:
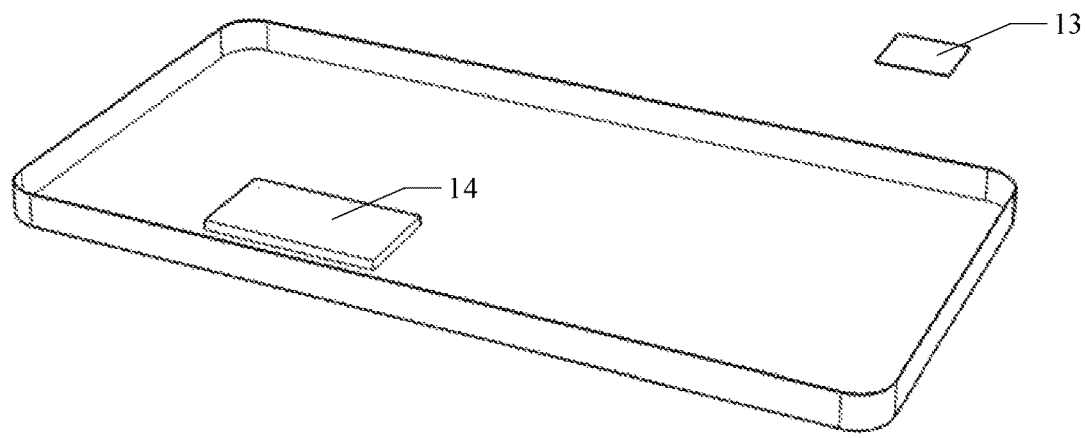
Figure 1C:
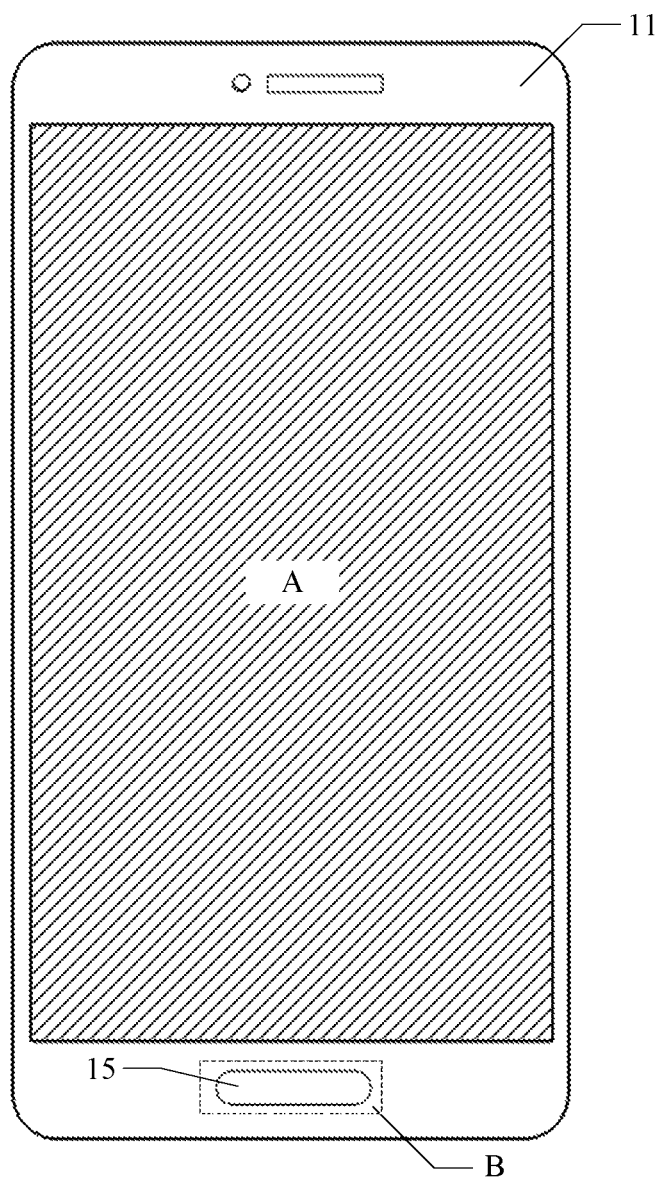
FIG. 1C is a top view of a terminal, according to an exemplary embodiment.

An exemplary embodiment of the present disclosure provides a terminal. With reference to FIGS. 1A, 1B and 1C, FIG. 1A is an overall structure diagram of the terminal, FIG. 1B is a perspective structure diagram of the terminal and FIG. 1C is a top view of the terminal. The terminal includes: a screen cover plate 11, a touch sensor 12, a pressure sensor 13 and a processing chip 14.

The screen cover plate 11 includes a display area portion and a key area portion, and a touch key is formed in the key area portion. Under a normal condition, the screen cover plate 11 is made from a glass material, and is also called a glass cover plate. In the embodiment of the present disclosure, the screen cover plate 11 may also be made from another material including but not limiting a transparent stone.

In the schematic embodiment, referring to FIG. 1C, the screen cover plate 11 is a whole piece of material, and the display area portion is shown as a shadow area portion A in FIG. 1C. The key area portion is not overlapped with the display area portion, the key area portion is located outside the display area portion, and the key area portion is shown as an area portion B enclosed by a dashed box in FIG. 1C. The touch key 15 is formed in the key area portion for a user to trigger a touch operation. For example, the touch key 15 is a long-strip area portion in the key area portion shown in FIG. 1C.

Figure 1D:
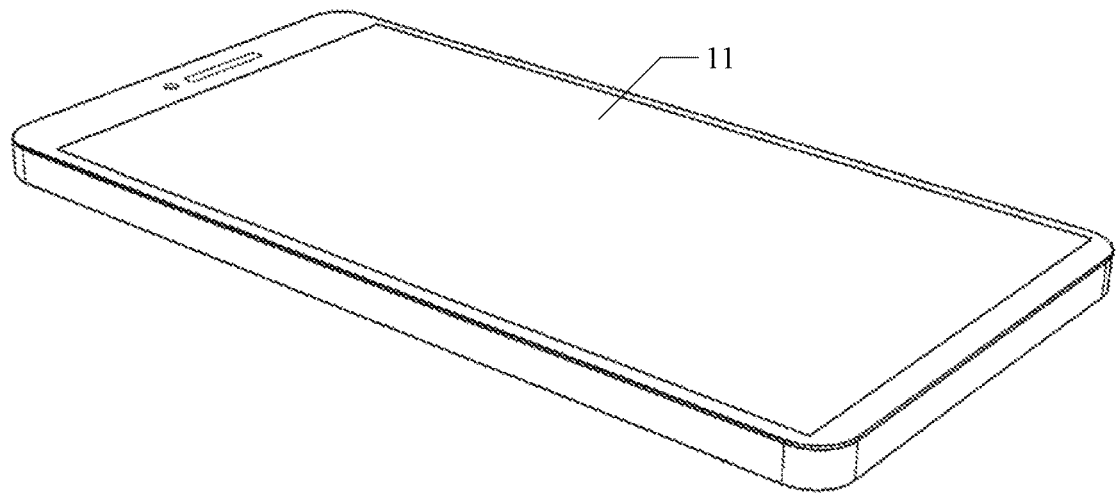
FIG. 1D is an overall structure diagram of a terminal, according to another exemplary embodiment.
Figure 1E:
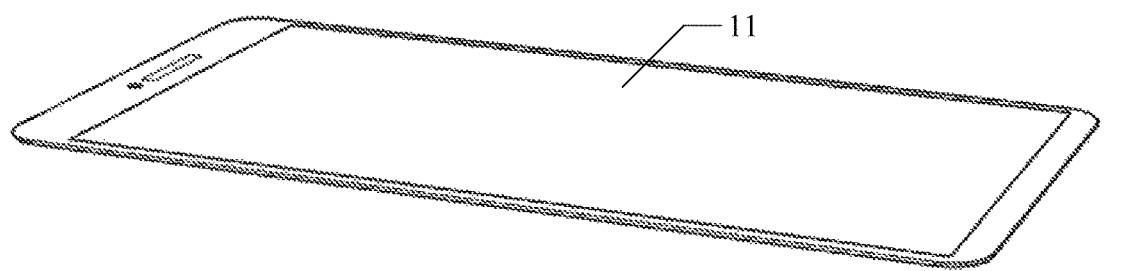
FIG. 1E is a perspective structure diagram of a terminal, according to another exemplary embodiment.
Figure 1E:
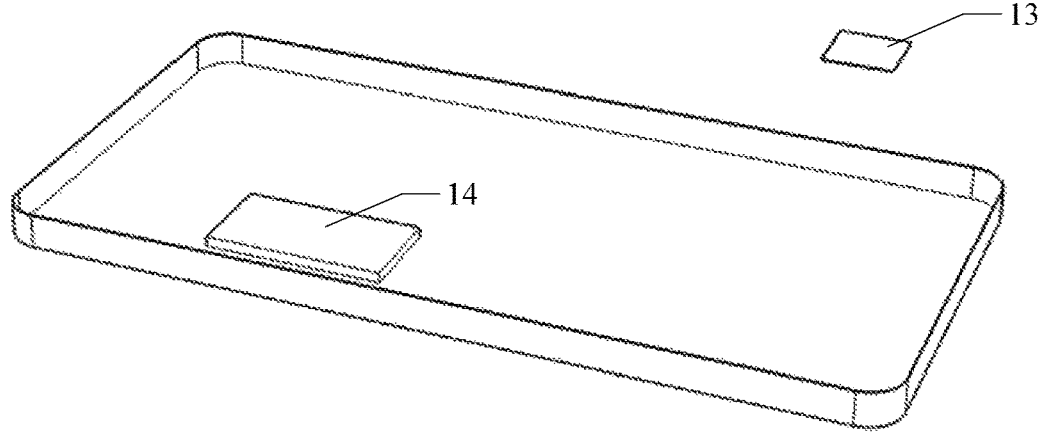
Figure 1F:
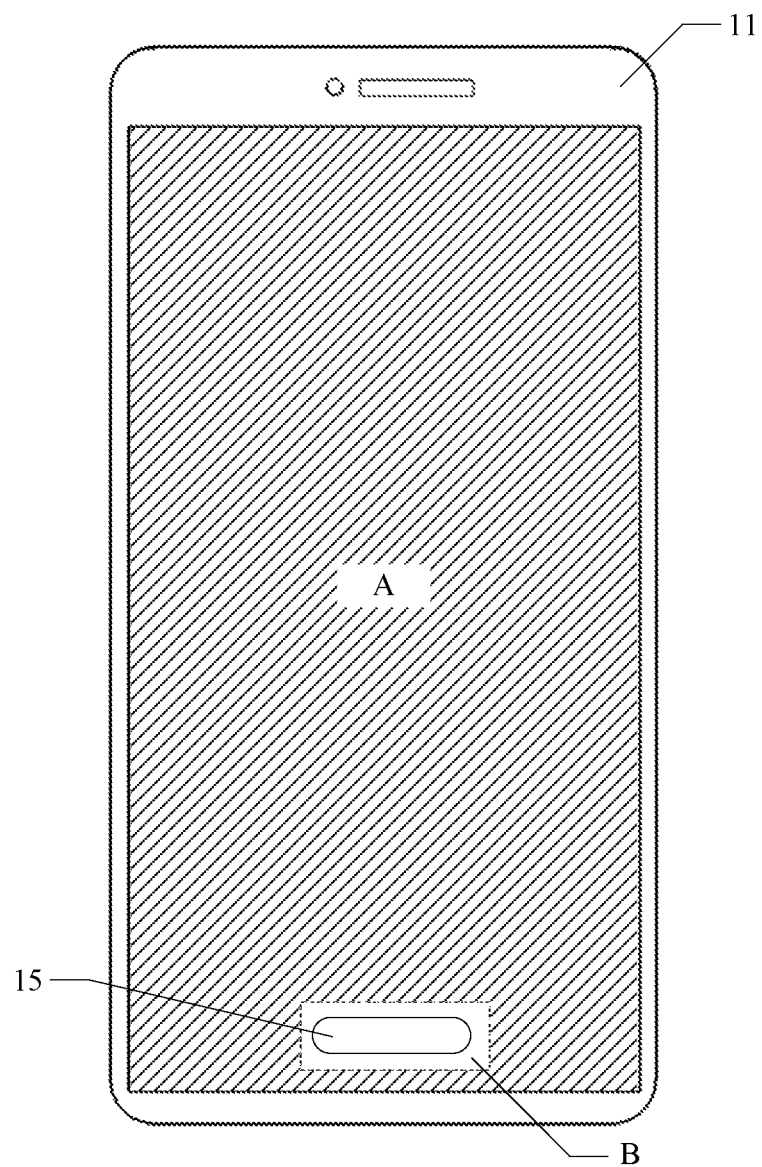
FIG. 1F is a top view of a terminal, according to another exemplary embodiment.

Another exemplary embodiment of the present disclosure provides a terminal. With reference to FIGS. 1D, 1E and 1F, FIG. 1D is an overall structure diagram of the terminal, FIG. 1E is a perspective structure diagram of the terminal and FIG. 1F is a top view of the terminal. In the schematic embodiment, the key area portion is located in the display area portion. In the embodiment, a position of the key area portion in the display area portion is not limited. For example, the display area portion is shown as a shadow portion A in FIG. 1F, the key area portion is shown as an area portion B enclosed by a dashed box in FIG. 1F, and the key area portion is located at a bottom of the display area portion. The touch key is formed in the key area portion for the user to trigger the touch operation. For example, the touch key 15 is a long-strip key displayed in the display area portion in FIG. 1F. In addition, the touch key 15 may always be displayed in a display screen; or, the touch key 15 may also be triggered by the user to be displayed or hidden. For example, the touch key 15 is triggered by an upward swipe of the user from the bottom of the screen to be displayed, and the touch key 15 is triggered by a downward swipe to the bottom of the screen to be hidden.

It is noted that the display area portion, the key area portion and the touch key are obtained by dividing different areas of the screen cover plate 11 in terms of function, while the screen cover plate 11 is not actually divided into different blocks, and the screen cover plate 11 is a whole piece of material.

As shown in FIG. 1B or 1E, the touch sensor 12 is arranged below the touch key 15. The pressure sensor 13 is arranged below the touch key 15. The processing chip 14 is electrically connected with the touch sensor 12 and the pressure sensor 13 respectively.

In the embodiment of the present disclosure, a key corresponding to the touch key 15 is a touch key. In an example, with reference to FIGS. 1A, 1B and 1C, the touch key may be a key outside the display area portion (i.e. the display screen of the terminal). In another example, with reference to FIGS. 1D, 1E and 1F, the touch key may be a key formed in the display area portion (i.e. the display screen of the terminal). For example, the touch key may be a key which is displayed in the display screen on the basis of software to virtually realize a key function, such as a key bar, a suspension ball or the like.

Since the touch sensor 12 and the pressure sensor 13 are arranged below the touch key 15, the touch sensor 12 is configured to detect and identify the touch operation (including light touch, double click, long pressing or the like) and the pressure sensor 13 is configured to detect and identify a pressure touch operation, the user may trigger multiple different types of operations such as light touch, pressing, double click and long pressing at the touch key 15 to realize multiple different functions by only one key.

From the above, according to the terminal provided by the embodiment of the present disclosure, the touch key is formed in the key area portion of the screen cover plate, and the touch sensor and the pressure sensor are arranged below the touch key. Thus, it avoids that a three-key design occupies a large front space and that separate distribution of three keys is unfavorable for a one-hand operation of the user. Accordingly, multiple different functions may be realized by only one key, reducing the number of keys, saving the front space of the terminal, reducing complexity in appearance and hardware structure of the terminal and facilitating the one-hand operation of the user.

Furthermore, compared with a conventional physical key, the touch key provided by the embodiment of the present disclosure occupies a smaller structural space, has longer service life, and is favorable for increasing a screen proportion of the terminal and reducing maintenance cost.

In order to satisfy an operating habit of the user, the key, configured to realize each function, of the terminal is usually arranged at a lower portion of a display area of the screen, while the position is usually a position where an antenna device is located. If a three-key design manner provided by the related technology is adopted, a larger space may be occupied at the position, and spatial and structural limitation will bring into arrangement of the antenna device. With adoption of the technical solution provided by the embodiment of the present disclosure, since multiple different functions may be realized by only one key, an occupied space of the lower portion of the screen of the terminal may be reduced to provide a larger space for another functional device (such as the antenna device), thereby making a function and structural design at the position more flexible and diversified.

Figure 2:
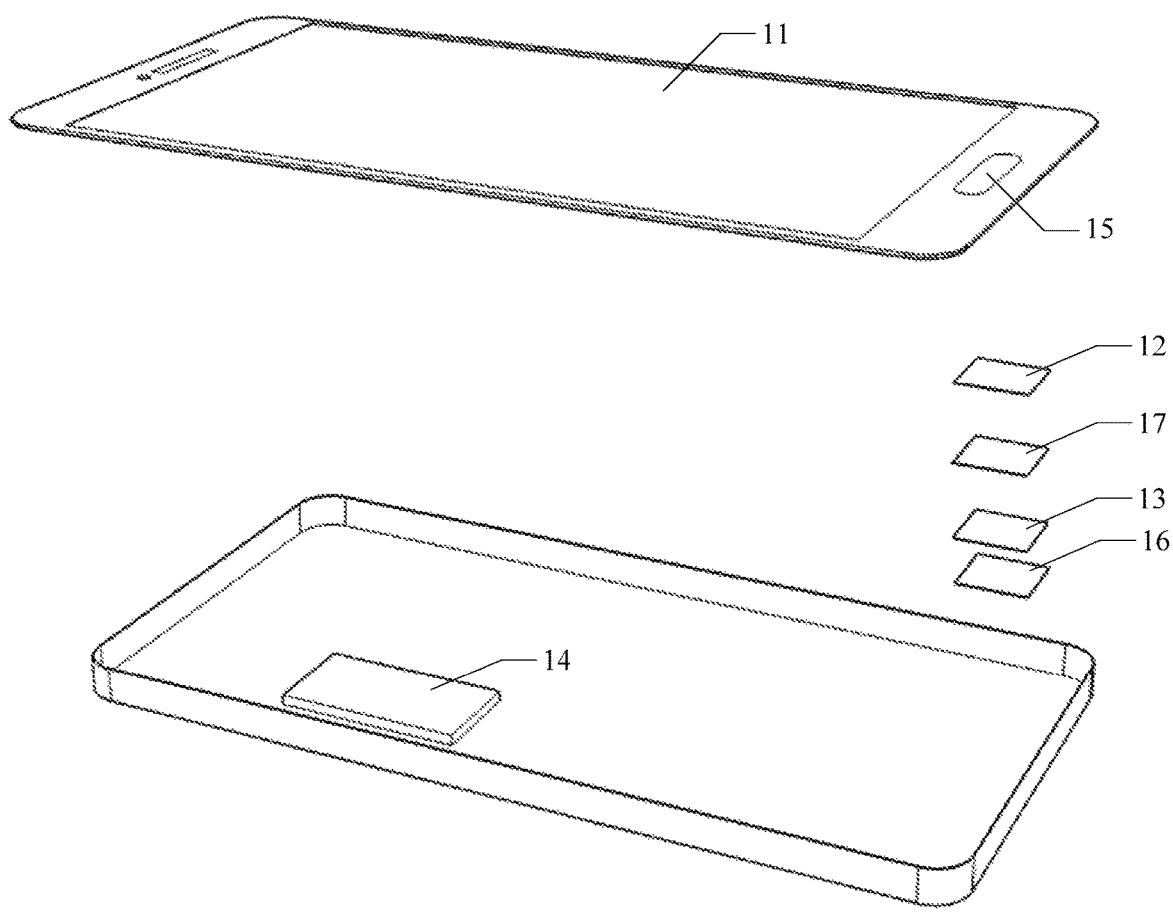
FIG. 2 is a perspective structure diagram of a terminal, according to another exemplary embodiment.

Another exemplary embodiment of the present disclosure provides a terminal. FIG. 2 is a perspective structure diagram of the terminal. An overall structure diagram of the terminal may refer to FIG. 1A. A top view of the terminal may refer to FIG. 1C. The terminal includes: a screen cover plate 11, a touch sensor 12, a pressure sensor 13 and a processing chip 14.

The screen cover plate 11 includes a display area portion and a key area portion, and a touch key 15 is formed in the key area portion. Introductions and descriptions about the screen cover plate 11 may refer to the above, and will not be elaborated herein.

In an embodiment, as shown in FIG. 2, the key area portion is located at a lower portion of the screen cover plate 11, that is, the touch key 15 is located at the lower portion of the screen cover plate 11, which is consistent with an operating habit of a user.

In addition, in order to enable the user to conveniently acquire a position of the touch key 15 in the screen cover plate 11, the touch key 15 may be highlighted. In an example, the touch key 15 in the key area portion is formed by a surface-sunken position. Of course, in another possible implementation mode, a mark may also be formed at a position corresponding to the touch key 15 above, below or in the screen cover plate 11, and the touch key 15 is identified by the mark. For example, the mark may be formed in a paint spraying manner, or in an indicator lamp manner or the like.

As shown in FIG. 2, the touch sensor 12 is arranged below the touch key 15. The pressure sensor 13 is arranged below the touch key 15. The processing chip 14 is electrically connected with the touch sensor 12 and the pressure sensor 13 respectively. In the embodiment, a position relationship between the touch sensor 12 and the pressure sensor 13 is not limited. In an example, the pressure sensor 13 is arranged below the touch sensor 12. In the embodiment of the present disclosure, since touch sensor 12 and the pressure sensor 13 are arranged below the touch key 15, the touch sensor 12 is configured to detect and identify a touch operation and the pressure sensor 13 is configured to detect and identify a pressure touch operation, the user may trigger multiple different types of operations such as light touch, pressing, double click and long pressing at the touch key 15 to realize multiple different functions by only one key. In addition, in the embodiment of the present disclosure, a type of the touch sensor 12 is not limited, and for example, the touch sensor 12 may be capacitive or resistive. In the embodiment of the present disclosure, a type of the pressure sensor 13 is also not limited, and for example, the pressure sensor 13 may be capacitive, resistive or inductive.

The pressure sensor 13 includes a first electrode layer and a second electrode layer which are correspondingly arranged at upper and lower layers. The screen cover plate 11 is deformed under the action of pressure to change a distance or contact area between the first electrode layer and the second electrode layer to implement pressure measurement. For example, if the pressure sensor 13 is a capacitive pressure sensor, the capacitive pressure sensor includes parallel-plate capacitor devices which are correspondingly arranged at upper and lower layers. The screen cover plate 11 may be deformed to further cause a change in a distance between the two layers of parallel-plate capacitor devices of the pressure sensor 13 when the user presses the touch key 15 in the screen cover plate 11, and the change in the distance may change capacitance between the two layers of parallel-plate capacitor devices. A pressure value of the touch operation triggered by the user may be calculated by detecting electrical signals (such as voltages) of the two layers of parallel-plate capacitor devices.

In the embodiment of the present disclosure, the touch sensor 12 and the pressure sensor 13 are arranged below the touch key 15 to identify different touch operations of the user and respond to pre-defined interaction instructions. For example, the processing chip 14 is configured to determine an operation type corresponding to the touch operation according to the touch operation acting on the touch key 15 and execute an operation corresponding to the operation type. The touch operation is triggered by the user, and when the user is required to trigger execution of a certain operation through the touch key 15, the touch operation is triggered at the touch key 15. The operation type includes, but not limited to, at least one of a light touch operation, a pressing operation, a double-click operation and a long pressing operation.

In an example, the processing chip 14 is configured to acquire the pressure value of the touch operation through the pressure sensor, judge whether the pressure value meets (namely falls within) a preset threshold value interval or not, the preset threshold value interval including a preset light touch threshold value interval and a preset pressing threshold value interval, determine that the operation type corresponding to the operation is a light touch operation if the pressure value meets the preset light touch threshold value interval, and determine that the operation type corresponding to the operation is a pressing operation if the pressure value meets the preset pressing threshold value interval. For example, if the pressure value is represented by f, the preset light touch threshold value interval is $0 \leq f < f_1$, and the preset pressing threshold value interval is $f \geq f_1$, wherein $f_1$ is a preset constant and its value is more than 0. Considering that a certain pressure value may be generated by a light touch operation, different preset threshold value intervals are set, and the light touch operation and the pressing operation are distinguished to avoid mistaken identification by means of the preset threshold value intervals.

In an embodiment, the processing chip 14 is further configured to determine that the operation type corresponding to the touch operation is a double-click operation if another touch operation meeting a preset condition is acquired within a preset time length when the operation type is the light touch operation, wherein the preset condition refers to that the touch operation acts on the touch key and a corresponding operation type is also the light touch operation. In such a manner, the double-click operation is identified.

In an embodiment, the processing chip 14 is further configured to acquire a duration of the light touch operation when the operation type is the light touch operation, and determine that the operation type corresponding to the touch operation is a long pressing operation if the duration is longer than a preset duration. In such a manner, the long pressing operation is identified.

For example, if the terminal supports identification of three different types of operations such as the light touch operation, the pressing operation and the double-click operation, the processing chip 14 is configured to: execute one of a returning operation, a quitting operation and a switching operation when the operation type is the light touch operation, the pressing operation or the double-click operation, wherein the returning operation is configured to trigger returning from a current page to a previous page, the quitting operation is configured to trigger returning from the current page to a desktop menu page and the switching operation is configured to trigger switching from a current task to a target task. In an example, the processing chip 14 is configured to: execute the returning operation when the operation type is the light touch operation; execute the quitting operation when the operation type is the pressing operation; and execute the switching operation when the operation type is the double-click operation. It is noted that the operation corresponding to each of the operation types is only exemplary, and during a practical application, the operation corresponding to each of the operation types may be set as a default by a system or defined by the user according to a practical requirement, which will not be limited in the embodiment of the present disclosure.

In another example, the processing chip 14 is configured to acquire a pressure value of the touch operation through the pressure sensor 13, judge whether the pressure value meets a preset pressing threshold value interval or not, the preset pressing threshold value interval including multiple preset pressure threshold value intervals corresponding to different preset interaction operations respectively. For example, there are two preset pressing threshold value intervals: the preset pressing threshold value interval including a preset light pressing threshold value interval and a preset heavy pressing threshold value interval. It is determined that the operation type corresponding to the touch operation is a light pressing operation if the pressure value meets the preset light pressing threshold value interval, and it is determined that the operation type corresponding to the touch operation is a heavy pressing operation if the pressure value meets the preset heavy pressing threshold value interval. For example, if the pressure value is represented by f, the preset light pressing threshold value interval is $f_2 \leq f < f_3$, and the preset heavy pressing threshold value interval is $f \geq f_3$, wherein $f_2$ and $f_3$ are preset constants and $f_3 > f_2 > 0$. It is noted that the descriptions are made only with the condition that the preset pressing threshold value interval includes two intervals and the pressing operations have two different operation types, i.e. the light pressing operation and the heavy pressing operation, as an example. In another possible implementation mode, the preset pressing threshold value interval may include n pressure threshold value intervals, and the pressing operations have correspondingly n different operation types, wherein n is an integer more than 1, and for example, n may be 2, 3, 4 or the like. Principles for the other multiple preset pressing threshold value intervals are the same, and will not be elaborated one by one.

In addition, for multiple different operation types of the pressing operations, different functions may be correspondingly set for different operation types, and the processing chip 14 executes operations corresponding to the operation types to realize the corresponding functions. For example, if the pressing operations include two different operation types of the light pressing operation and the heavy pressing operation, the processing chip 14 is configured to: execute a first operation when the operation type is the light pressing operation, and execute a second operation when the operation type is a heavy pressing operation. The first operation is different from the second operation. For example, the first operation may be the quitting operation, and the quitting operation is configured to trigger returning from the current page to the desktop menu page; and the second operation may be a screen turning-off/on operation, and the screen turning-off/on operation is configured to trigger the screen to be switched from an on state to an off state or be switched from the off state to the on state. In an example, the processing chip 14 is configured to: execute the quitting operation when the operation type is the light touch operation; execute the returning operation when the operation type is the light pressing operation; execute the switching operation when the operation type is the heavy pressing operation; execute an operation of jumping to a preset application (or an operation of jumping to a previous application) when the operation type is the double-click operation; or the like.

In another example, the processing chip 14 is configured to acquire a pressure value of the touch operation through the pressure sensor 13, judge whether the pressure value meets a preset threshold value interval or not, the preset threshold value interval including a preset light touch threshold value interval and a preset pressing threshold value interval, determine that the operation type corresponding to the touch operation is a light touch operation when the pressure value meets the preset light touch threshold value interval, and if the pressure value meets the preset pressing threshold value interval, acquire a pressure threshold value interval to which the pressure value belongs and acquire the operation type corresponding to the pressure threshold value interval, wherein the preset pressing threshold value interval includes n pressure threshold value intervals, and n is an integer more than 1. For example, the preset pressing threshold value interval includes a preset light pressing threshold value interval and a preset heavy pressing threshold value interval, and the processing chip 14 is configured to: determine that the operation type corresponding to the touch operation is a light pressing operation when the pressure value meets the preset light pressing threshold value interval, and determine that the operation type corresponding to the touch operation is a heavy pressing operation when the pressure value meets the preset heavy pressing threshold value interval. Exemplarily, the pressure value is represented by f, the preset light touch threshold value interval is $0 \leq f \leq f_1$, the preset pressing threshold value interval is $f \geq f_1$, the preset light touch threshold value interval is $f_1 \leq f < f_2$, and the preset heavy pressing threshold value interval is $f \geq f_2$, wherein $f_1$ and $f_2$ are preset constants and $f_2 > f_1 > 0$.

In such a manner, the pressing operation is further divided into multiple different operation types according to the pressure value, and different functions are set for different operation types, thereby further enriching functions which may be realized by the touch key 15.

In an embodiment, as shown in FIG. 2, the terminal further includes: a vibration feedback component 16 electrically connected with the processing chip 14. The vibration feedback component 16 is arranged below the touch key 15. In an example, the vibration feedback component 16 is arranged below the pressure sensor 13. The vibration feedback component 16 may be a vibration motor or a vibration plate. The processing chip 14 is further configured to determine a vibration characteristic of the vibration feedback component 16 according to the pressure value, acquired by the pressure sensor 13, of the touch operation, and control the vibration feedback component 16 to vibrate according to the vibration characteristic, wherein different pressure values correspond to different vibration characteristics, or different pressure threshold value intervals correspond to different vibration characteristics. In an example, the processing chip 14 is further configured to acquire a pressure threshold value interval to which the pressure value of the touch operation belongs when it is determined that the operation type is the pressing operation, determine a vibration characteristic of the vibration feedback component 16 according to the pressure threshold value interval, and control the vibration feedback component 16 to vibrate according to the vibration characteristic. The terminal may store a preset relationship, and the preset relationship includes multiple groups of relationships between pressure threshold value intervals and vibration characteristics. The processing chip 14 queries the preset relationship to acquire the vibration characteristic corresponding to the pressure threshold value interval to which the pressure value belongs after determining that the operation type is the pressing operation according to the pressure value of the touch operation. In addition, the vibration characteristic may include a vibration frequency and/or a vibration amplitude. In such a manner, the user may perceive a touch feedback corresponding to a magnitude of the pressure of the touch operation, so that operation experiences of the user are improved.

In an embodiment, as shown in FIG. 2, the terminal further includes: a fingerprint identification sensor 17 electrically connected with the processing chip 14. The fingerprint identification sensor 17 is arranged below the touch key 15. In an example, the fingerprint identification sensor 17 is arranged between the touch sensor 12 and the pressure sensor 13. The processing chip 14 is further configured to acquire a fingerprint image for identity authentication through the fingerprint identification sensor. In an embodiment, the processing chip 14 is configured to acquire the fingerprint image through the fingerprint identification sensor when the terminal is in a preset mode, wherein the preset mode includes, but not limited to, at least one of a screen-locked mode, a payment mode and an identity authentication mode. In such a manner, a fingerprint identification function of the touch key 15 is expanded, so that each operation requirement of the user is better met.

In a possible implementation mode, when the terminal includes the touch sensor 12, the pressure sensor 13, the vibration feedback component 16 and the fingerprint identification sensor 17, as shown in FIG. 2, the touch sensor 12 is arranged below the touch key 15, the pressure sensor 13 is arranged below the touch sensor 12, the vibration feedback component 16 is arranged below the pressure sensor 13, and the fingerprint identification sensor 17 is arranged between the touch sensor 12 and the pressure sensor 13. In other words, the touch sensor 12, the fingerprint identification sensor 17, the pressure sensor 13 and the vibration feedback component 16 are sequentially arranged below the touch key 15. In such a device arrangement manner, high working performance of each device may be ensured.

From the above, according to the terminal provided by the embodiment, the touch key is formed in the key area portion of the screen cover plate, and the touch sensor and the pressure sensor are arranged below the touch key. Thus, it avoids that a three-key design occupies a large front space and that separate distribution of three keys is unfavorable for a one-hand operation of the user. Accordingly, multiple different functions may be realized by only one key, reducing the number of keys, saving the front space of the terminal, reducing complexity in appearance and hardware structure of the terminal and facilitating the one-hand operation of the user.

In addition, the vibration feedback component is also arranged below the touch key, and then the user may perceive the touch feedback corresponding to the magnitude of the pressure of the touch operation, so that the operation experiences of the user are improved.

Moreover, the fingerprint identification sensor is further arranged below the touch key to expand the fingerprint identification function of the touch key, so that each operation requirement of the user is better met.

Figure 3A:
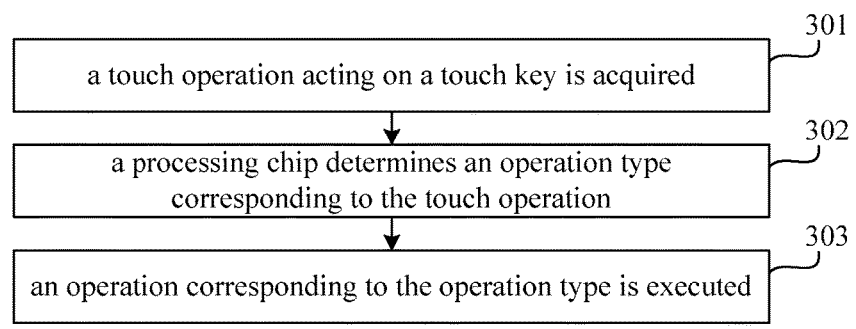
FIG. 3A is a flow chart showing a touch response method, according to an exemplary embodiment.

FIG. 3A is a flow chart showing a touch response method, according to an exemplary embodiment. The method may be applied to the terminal provided by the abovementioned embodiment. An execution body of each step of the method may be a processing chip of the terminal, and each step may also be executed by interaction and matching between the processing chip and another processing unit (such as a Central Processing Unit (CPU)). In order to facilitate description, the execution body of each step is the processing chip of the terminal, but is not limited. The method may include the following steps.

Step 301: a touch operation acting on a touch key is acquired.

The processing chip acquires the touch operation acting on the touch key. The touch operation is triggered by a user, and when the user is required to trigger execution of a certain operation through the touch key, the touch operation is triggered at the touch key.

Step 302: a processing chip determines an operation type corresponding to the touch operation.

The operation type includes, but not limited to, at least one of a light touch operation, a pressing operation, a double-click operation and a long pressing operation.

Figure 3B:
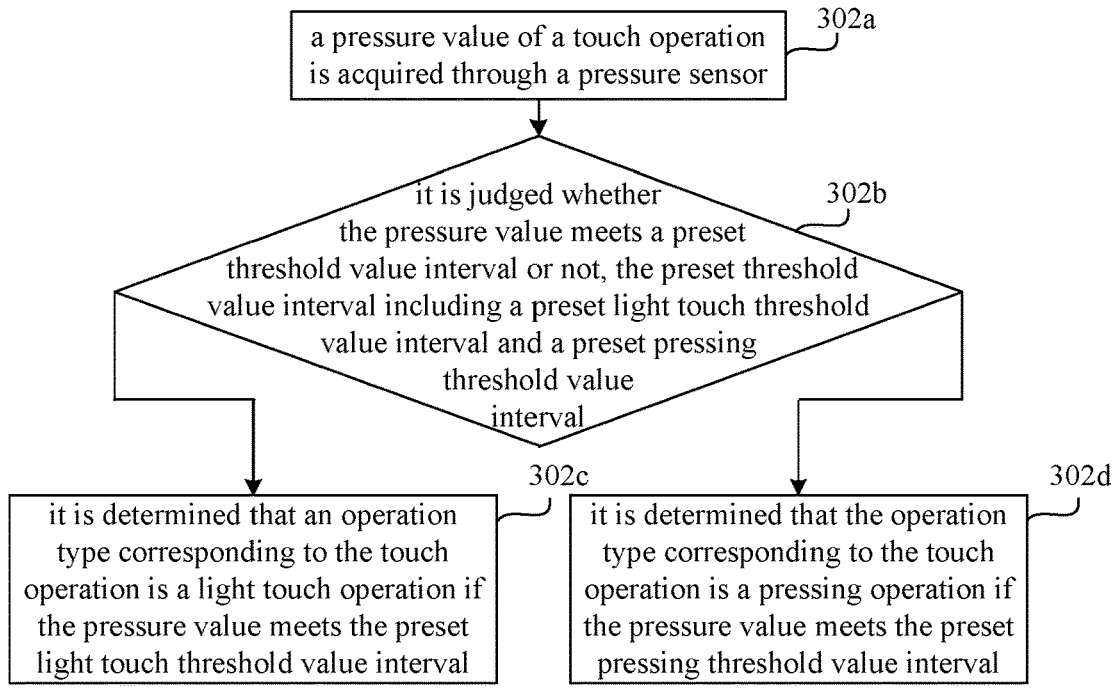
FIG. 3B is an exemplary flow chart showing Step 302 involved in an embodiment shown in FIG. 3A.

In an example, as shown in FIG. 3B, the step includes the following sub-steps:

Step 302a: a pressure value of the touch operation is acquired through a pressure sensor;

Step 302b: it is judged whether the pressure value meets a preset threshold value interval or not, the preset threshold value interval including a preset light touch threshold value interval and a preset pressing threshold value interval;

Step 302c: it is determined that the operation type corresponding to the touch operation is a light touch operation if the pressure value meets the preset light touch threshold value interval; and Step 302d: it is determined that the operation type corresponding to the touch operation is a pressing operation if the pressure value meets the preset pressing threshold value interval.

For example, if the pressure value is represented by f, the preset light touch threshold value interval is $0 \leq f < f_1$, and the preset pressing threshold value interval is $f \geq f_1$, wherein $f_1$ is a preset constant and its value is more than 0. Considering that a certain pressure value may be generated by a light touch operation, different preset threshold value intervals are set, and the light touch operation and the pressing operation are distinguished by means of the preset threshold value intervals to avoid mistaken identification.

In an embodiment, the processing chip determines that the operation type corresponding to the touch operation is a double-click operation if another touch operation meeting a preset condition is acquired within a preset time length when the operation type is the light touch operation, wherein the preset condition refers to that the touch operation acts on the touch key and a corresponding operation type is also the light touch operation. In such a manner, the double-click operation is identified.

In an embodiment, the processing chip acquires a duration of the light touch operation when the operation type is the light touch operation, and determines that the operation type corresponding to the touch operation is a long pressing operation if the duration is longer than a preset duration. In such a manner, the long pressing operation is identified.

Figure 3C:
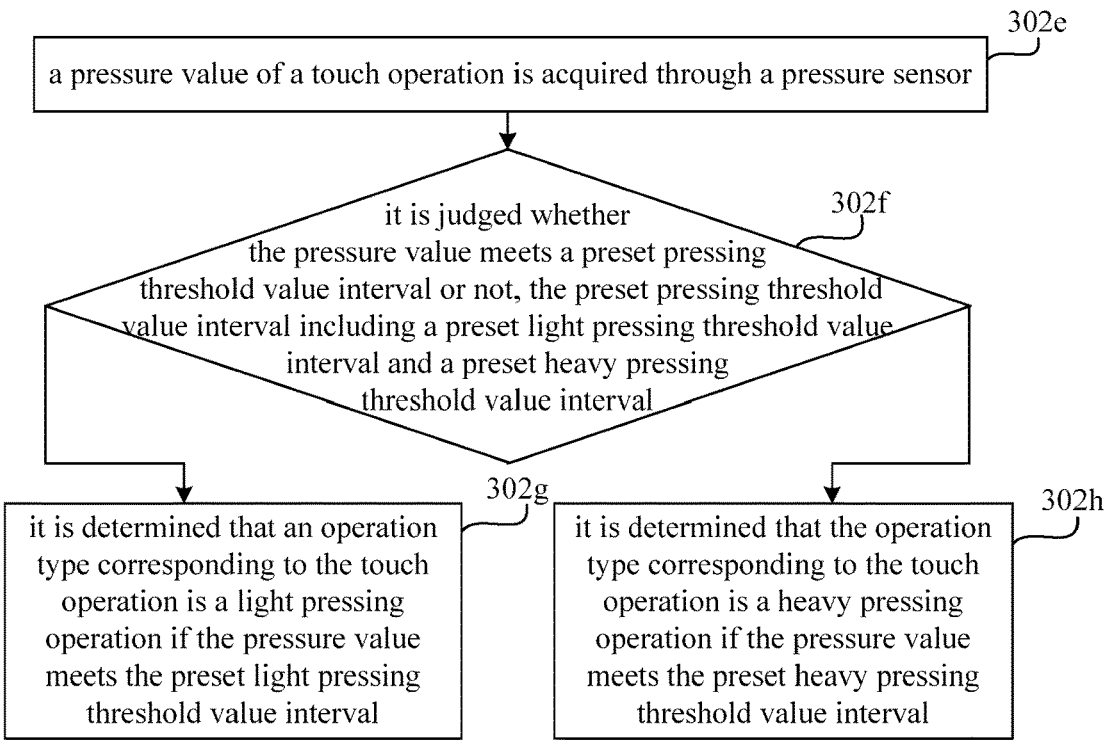
FIG. 3C is another exemplary flow chart showing Step 302 involved in an embodiment shown in FIG. 3A.

In another example, as shown in FIG. 3C, the step includes the following sub-steps:

Step 302e: a pressure value of the touch operation is acquired through the pressure sensor;

Step 302f: it is judged whether the pressure value meets a preset pressing threshold value interval or not, the preset pressing threshold value interval including a preset light pressing threshold value interval and a preset heavy pressing threshold value interval;

Step 302g: it is determined that the operation type corresponding to the touch operation is a light pressing operation if the pressure value meets the preset light pressing threshold value interval; and Step 302h: it is determined that the operation type corresponding to the touch operation is a heavy pressing operation if the pressure value meets the preset heavy pressing threshold value interval.

For example, if the pressure value is represented by f, the preset light pressing threshold value interval is $f_2 \leq f < f_3$, and the preset heavy pressing threshold value interval is $f \geq f_3$, wherein $f_2$ and $f_3$ are preset constants and $f_3 > f_2 > 0$. It is noted that the descriptions are made only with the condition that the preset pressing threshold value interval includes two intervals and the pressing operations have two different operation types, i.e. the light pressing operation and the heavy pressing operation, as an example. In another possible implementation mode, the preset pressing threshold value interval may include n pressure threshold value intervals, and the pressing operations have correspondingly n different operation types, wherein n is an integer more than 1, and for example, n may be 2, 3, 4 or the like. Principles for the other multiple preset pressing threshold value intervals are the same, and will not be elaborated one by one.

Figure 3D:
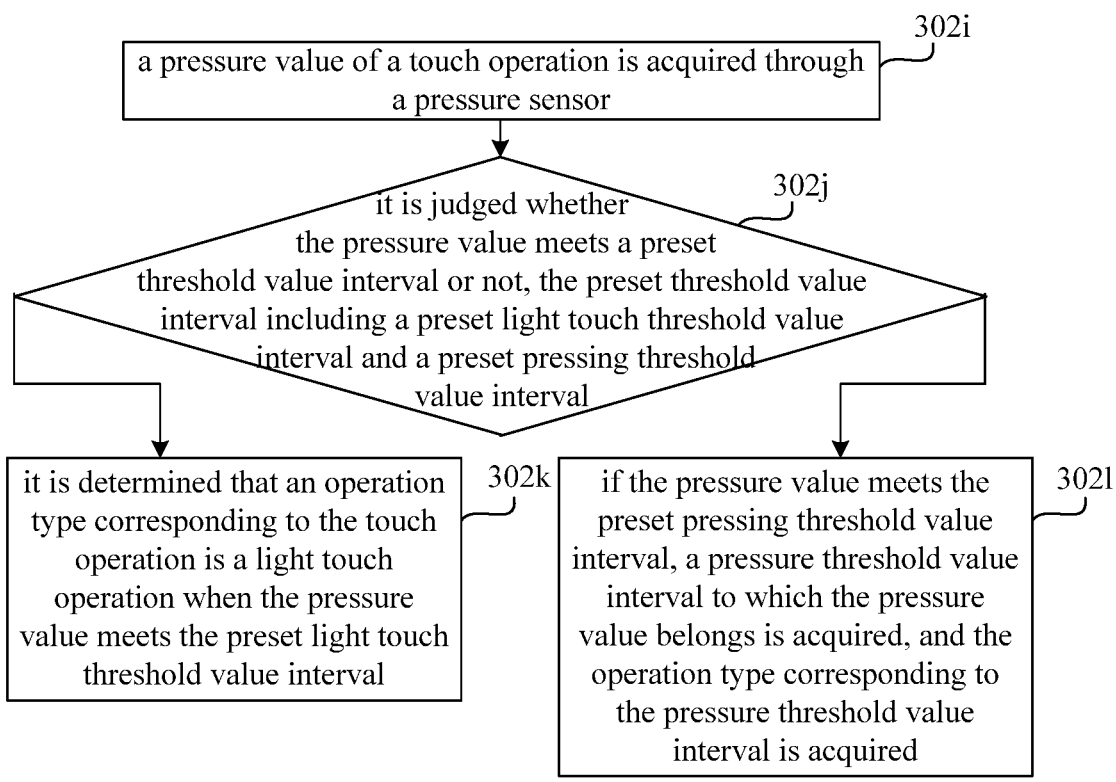
FIG. 3D is another exemplary flow chart showing Step 302 involved in an embodiment shown in FIG. 3A.

In another example, as shown in FIG. 3D, the step includes the following sub-steps:

Step 302i: a pressure value of the touch operation is acquired through the pressure sensor;

Step 302j: it is judged whether the pressure value meets a preset threshold value interval or not, the preset threshold value interval including a preset light touch threshold value interval and a preset pressing threshold value interval;

Step 302k: it is determined that the operation type corresponding to the touch operation is a light touch operation when the pressure value meets the preset light touch threshold value interval; and Step 302f: if the pressure value meets the preset pressing threshold value interval, a pressure threshold value interval to which the pressure value belongs is acquired, and the operation type corresponding to the pressure threshold value interval is acquired.

Herein, the preset pressing threshold value interval includes n pressure threshold value interval, and n is an integer more than 1. For example, the preset pressing threshold value interval includes a preset light pressing threshold value interval and a preset heavy pressing threshold value interval. The processing chip determines that the operation type corresponding to the touch operation is a light pressing operation when the pressure value meets the preset light pressing threshold value interval, and determines that the operation type corresponding to the touch operation is a heavy pressing operation when the pressure value meets the preset heavy pressing threshold value interval. Exemplarily, the pressure value is represented by f, the preset light touch threshold value interval is $0 \le f < f_1$, the preset pressing threshold value interval is $f \ge f_1$, the preset light touch threshold value interval is $f_1 \le f < f_2$, and the preset heavy pressing threshold value interval is $f \ge f_2$, wherein $f_1$ and $f_2$ are preset constants and $f_2 > f_1 > 0$.

In such a manner, the pressing operations have multiple different operation types according to the different pressure values and different functions are set for different operation types, thereby further enriching functions which may be realized by the touch key.

Step 303: an operation corresponding to the operation type is executed.

The processing chip executes the operation corresponding to the operation type.

For example, the terminal supports identification of three different types of operations such as the light touch operation, the pressing operation and the double-click operation. The processing chip executes one of a returning operation, a quitting operation and a switching operation when the operation type is the light touch operation, the pressing operation or the double-click operation, wherein the returning operation is configured to trigger returning from a current page to a previous page, the quitting operation is configured to trigger returning from the current page to a desktop menu page and the switching operation is configured to trigger switching from a current task to a target task. In an example, the processing chip may execute the returning operation when the operation type is the light touch operation; the processing chip may execute the quitting operation when the operation type is the pressing operation; and the processing chip may execute the switching operation when the operation type is the double-click operation. It is noted that the operation corresponding to each of the operation types is only exemplary, and during a practical application, operation corresponding to each of the operation types may be set as a default by a system or defined by the user according to a practical requirement, which will not be limited in the embodiment of the present disclosure.

In an embodiment, for multiple different operation types of the pressing operation, different functions may be correspondingly set for different operation types, and the processing chip executes operations corresponding to the operation types to realize the corresponding functions. For example, if the pressing operation includes two different operation types of the light pressing operation and the heavy pressing operation, the processing chip executes a first operation when the operation type is the light pressing operation, and executes a second operation when the operation type is a heavy pressing operation. The first operation is different from the second operation. For example, the first operation may be the quitting operation, and the quitting operation is configured to trigger returning from the current page to the desktop menu page; the second operation may be a screen turning-off/on operation, and the screen turning-off/on operation is configured to trigger the screen to be switched from an on state to an off state or be switched from the off state to the on state. Alternatively, the first operation may be the switching operation which is configured to trigger switching from the current task to the target task and the second operation may be the returning operation which is configured to trigger returning from the current page to the previous page; or the like.

In an embodiment, the terminal further includes a vibration feedback component, and the vibration feedback component is arranged below the touch key. In an example, the vibration feedback component is arranged below the pressure sensor. The processing chip determines a vibration characteristic of the vibration feedback component according to the pressure value, acquired by the pressure sensor, of the touch operation, and controls the vibration feedback component to vibrate according to the vibration characteristic, wherein different pressure values correspond to different vibration characteristics, or different pressure threshold value intervals correspond to different vibration characteristics. In an example, the terminal may store a preset relationship, and the preset relationship includes multiple groups of relationships between pressure threshold value intervals and vibration characteristics. The processing chip queries the preset relationship to acquire the vibration characteristic corresponding to the pressure threshold value interval to which the pressure value belongs after determining that the operation type is the pressing operation according to the pressure value of the touch operation. In addition, the vibration characteristic may include a vibration frequency and/or a vibration amplitude. In such a manner, the user may perceive a touch feedback corresponding to a magnitude of the pressure of the touch operation, so that operation experiences of the user are improved.

In an embodiment, the terminal further includes a fingerprint identification sensor. The fingerprint identification sensor is arranged below the touch key. In an example, the fingerprint identification sensor is arranged between the touch sensor and the pressure sensor. The processing chip may further acquire a fingerprint image for identity authentication through the fingerprint identification sensor. In an example, the processing chip acquires the fingerprint image through the fingerprint identification sensor when the terminal is in a preset mode, wherein the preset mode includes, but not limited to, at least one of a screen-locked mode, a payment mode and an identity authentication mode. In such a manner, a fingerprint identification function of the touch key is expanded, so that each operation requirement of the user is better met.

From the above, according to the method provided by the embodiment, the touch key is formed in the key area portion of the screen cover plate, the touch sensor and the pressure sensor are arranged below the touch key, and after acquiring the touch operation acting on the touch key, the processing chip determines the operation type corresponding to the touch operation, and then executes the operation corresponding to the operation type. As such, it avoids that a three-key design occupies a large front space and that separate distribution of three keys is unfavorable for a one-hand operation of the user. Accordingly, multiple different functions may be realized by only one key, reducing the number of keys, saving the front space of the terminal, reducing complexity in appearance and hardware structure of the terminal and facilitating the one-hand operation of the user.

A device embodiment of the present disclosure will be described below, and may be configured to execute a method embodiment of the present disclosure. Details undisclosed in the device embodiment of the present disclosure refer to the method embodiment of the present disclosure.

Figure 4:
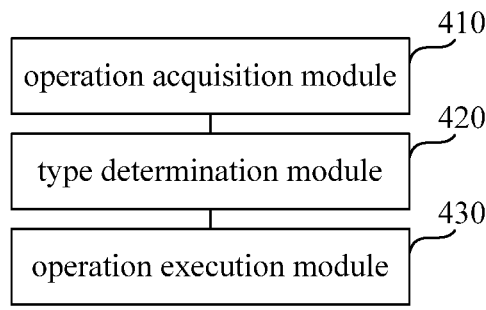
FIG. 4 is a block diagram of a touch response device, according to an exemplary embodiment.

FIG. 4 is a block diagram of a touch response device, according to an exemplary embodiment. The device has a function of implementing the abovementioned method, and the function may be realized through hardware, and may also be realized by software executed by hardware. The device may include: an operation acquisition module 410, a type determination module 420 and an operation execution module 430.

The operation acquisition module 410 is configured to acquire a touch operation acting on a touch key.

The type determination module 420 is configured to determine an operation type corresponding to the touch operation through a processing chip.

The operation execution module 430 is configured to execute an operation corresponding to the operation type.

From the above, according to the device provided by the embodiment, the touch key is formed in a key area portion of a screen cover plate, a touch sensor and a pressure sensor are arranged below the touch key, and after acquiring the touch operation acting on the touch key, the processing chip determines the operation type corresponding to the touch operation, and then executes the operation corresponding to the operation type. Thus, it avoids that a three-key design occupies a large front space and that separate distribution of three keys is unfavorable for a one-hand operation of the user. Accordingly, multiple different functions may be realized by only one key, reducing the number of keys, saving the front space of the terminal, reducing complexity in appearance and hardware structure of the terminal and facilitating the one-hand operation of the user.

Figure 5:
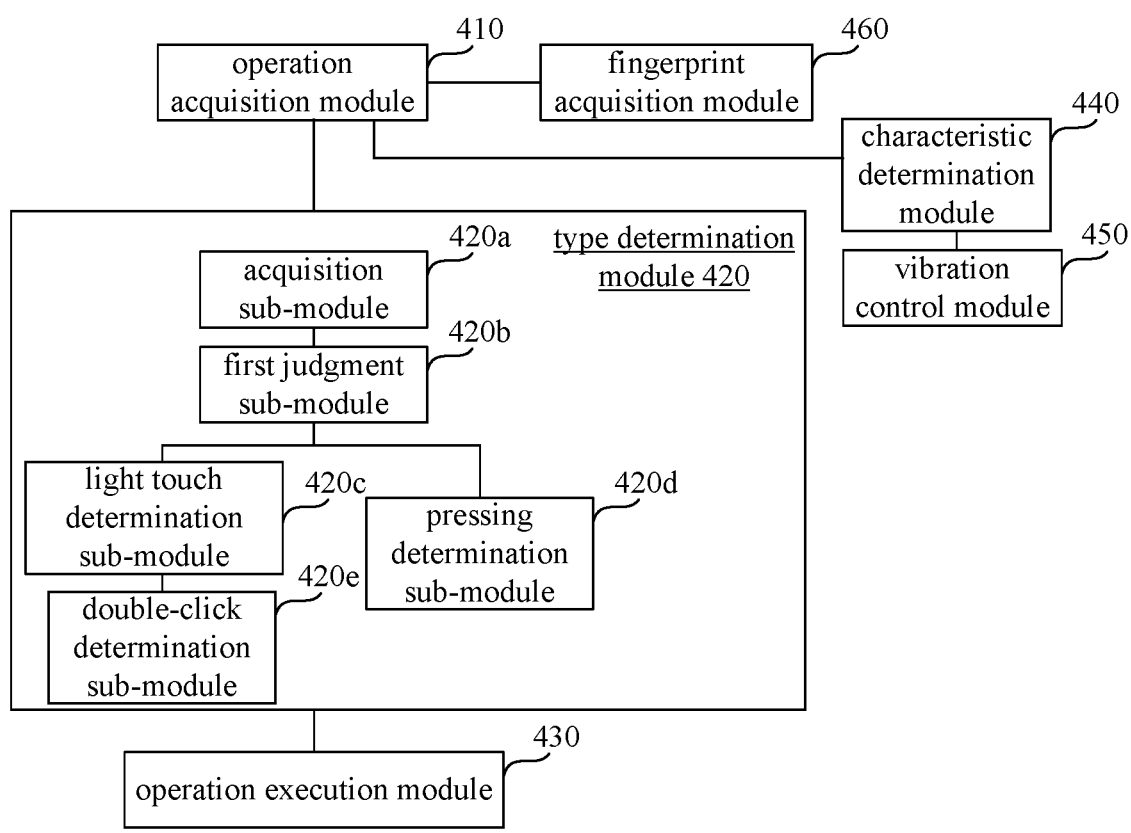
FIG. 5 is a block diagram of a touch response device, according to another exemplary embodiment.

In an embodiment provided on the basis of the embodiment shown in FIG. 4, as shown in FIG. 5, the type determination module 420 includes: an acquisition sub-module 420a, a first judgment sub-module 420b, a light touch determination sub-module 420c and a pressing determination sub-module 420d.

The acquisition sub-module 420a is configured to acquire a pressure value of the touch operation through a pressure sensor by means of the processing chip.

The first judgment sub-module 420b is configured to judge whether the pressure value meets a preset threshold value interval or not, the preset threshold value interval including a preset light touch threshold value interval and a preset pressing threshold value interval.

The light touch determination sub-module 420c is configured to determine that the operation type corresponding to the touch operation is a light touch operation if the pressure value meets the preset light touch threshold value interval.

The pressing determination sub-module 420d is configured to determine that the operation type corresponding to the touch operation is a pressing operation if the pressure value meets the preset pressing threshold value interval.

In an embodiment, the preset pressing threshold value interval includes a preset light pressing threshold value interval and a preset heavy pressing threshold value interval. The pressing determination module 420d is configured to: determine that the operation type corresponding to the touch operation is a light pressing operation when the pressure value meets the preset light pressing threshold value interval; and determine that the operation type corresponding to the touch operation is a heavy pressing operation when the pressure value meets the preset heavy pressing threshold value interval.

In an embodiment, the type determination module 420 further includes: a double-click determination sub-module 420e.

The double-click determination sub-module 420e is configured to determine that the operation type corresponding to the touch operation is a double-click operation if another touch operation meeting a preset condition is acquired within a preset time length when the operation type is the light touch operation, wherein the preset condition refers to that the touch operation acts on the touch key and the operation type thereof is also the light touch operation.

In an example, the operation execution module 430 is configured to execute one of a returning operation, a quitting operation and a switching operation when the operation type is the light touch operation, the pressing operation or the double-click operation, respectively. The returning operation is configured to trigger returning from a current page to a previous page, the quitting operation is configured to trigger returning from the current page to a desktop menu page and the switching operation is configured to trigger switching from a current task to a target task.

In an embodiment provided on the basis of the embodiment shown in FIG. 4, the type determination module 420 includes: an acquisition sub-module, a second judgment sub-module, a light pressing determination sub-module and a heavy pressing determination sub-module.

The acquisition sub-module is configured to acquire a pressure value of the touch operation through the pressure sensor by means of the processing chip.

The second judgment sub-module is configured to judge whether the pressure value meets a preset pressing threshold value interval or not, the preset pressing threshold value interval including a preset light pressing threshold value interval and a preset heavy pressing threshold value interval.

The light pressing determination sub-module is configured to determine that the operation type corresponding to the touch operation is a light pressing operation if the pressure value meets the preset light pressing threshold value interval.

The heavy pressing determination sub-module is configured to determine that the operation type corresponding to the touch operation is a heavy pressing operation if the pressure value meets the preset heavy pressing threshold value interval.

In an example, the operation execution module 430 is configured to execute a first operation when the operation type is the light pressing operation, and execute a second operation when the operation type is a heavy pressing operation, wherein the first operation is different from the second operation.

In another embodiment provided on the basis of the embodiment shown in FIG. 4, when the terminal includes a vibration feedback component electrically connected with the processing chip, the device further includes: a characteristic determination module 440 and a vibration control module 450.

The characteristic determination module 440 is configured to determine a vibration characteristic of the vibration feedback component according to the pressure value, acquired by the processing chip through the pressure sensor, of the touch operation.

The vibration control module 450 is configured to control the vibration feedback component to vibrate according to the vibration characteristic.

In another embodiment provided by the embodiment shown in FIG. 4, when the terminal includes a fingerprint identification sensor electrically connected with the processing chip, as shown in FIG. 5, the device further includes: a fingerprint acquisition module 460.

The fingerprint acquisition module 460 is configured to acquire a fingerprint image for identity authentication through the fingerprint identification sensor.

It is noted that only division of the abovementioned functional modules is taken as an example for descriptions when the device provided by the embodiment realizes its functions, and during a practical application, the functions may be allocated to different functional modules for realization according to a practical requirement, that is, the device is divided into different functional modules to realize all or part of the functions described above.

With respect to the devices in the above embodiments, the specific manners for performing operations for individual modules therein have been described in detail in the embodiments regarding the methods, which will not be elaborated herein.

An exemplary embodiment of the present disclosure further provides a terminal, which may implement a touch response method provided by the present disclosure. The terminal may be a terminal provided by the abovementioned embodiment. The terminal includes: a processor (the processor may be a processing chip in the abovementioned embodiment, and may also be another processing unit, such as a CPU, electrically connected with the processing chip in the abovementioned embodiment), and a memory configured to store instructions executable by the processor, wherein the processor is configured to: acquire a touch operation acting on a touch key; determine an operation type corresponding to the touch operation through a processing chip; and execute an operation corresponding to the operation type.

In an example, the processor is configured to: acquire a pressure value of the touch operation through a pressure sensor by means of the processing chip; judge whether the pressure value meets a preset threshold value interval or not, the preset threshold value interval including a preset light touch threshold value interval and a preset pressing threshold value interval; determine that the operation type corresponding to the touch operation is a light touch operation if the pressure value meets the preset light touch threshold value interval; and determine that the operation type corresponding to the touch operation is a pressing operation if the pressure value meets the preset pressing threshold value interval.

In an embodiment, the processor is further configured to: determine that the operation type corresponding to the touch operation is a double-click operation if another touch operation meeting a preset condition is acquired within a preset time length when the operation type is the light touch operation, wherein the preset condition refers to that the touch operation acts on the touch key and the operation type thereof is also the light touch operation.

In an embodiment, the processor the processor configured to execute the operation corresponding to the operation type is further configured to perform one of the following: executing a returning operation to return from a current page to a previous page when the operation type is the light touch operation; executing a quitting operation to return from the current page to a desktop menu page when the operation type is the pressing operation; executing a switching operation to switch from a current task to a target task when the operation type is the double-click operation.

In another example, the processor is configured to: acquire a pressure value of the touch operation through the pressure sensor by means of the processing chip; judge whether the pressure value meets a preset pressing threshold value interval or not, the preset pressing threshold value interval including a preset light pressing threshold value interval and a preset heavy pressing threshold value interval; determine that the operation type corresponding to the touch operation is a light pressing operation if the pressure value meets the preset light pressing threshold value interval; and determine that the operation type corresponding to the touch operation is a heavy pressing operation if the pressure value meets the preset heavy pressing threshold value interval.

In an embodiment, the processor is configured to: execute a first operation when the operation type is the light pressing operation; and execute a second operation when the operation type is a heavy pressing operation, wherein the first operation is different from the second operation.

In an embodiment, when the terminal includes a vibration feedback component electrically connected with the processing chip, the processor is further configured to: determine a vibration characteristic of the vibration feedback component according to the pressure value of the touch operation detected by the pressure sensor; and control the vibration feedback component to vibrate according to the vibration characteristic.

In an embodiment, when the terminal includes a fingerprint identification sensor electrically connected with the processing chip, the processor is further configured to: acquire a fingerprint image for identity authentication through the fingerprint identification sensor.

Figure 6:
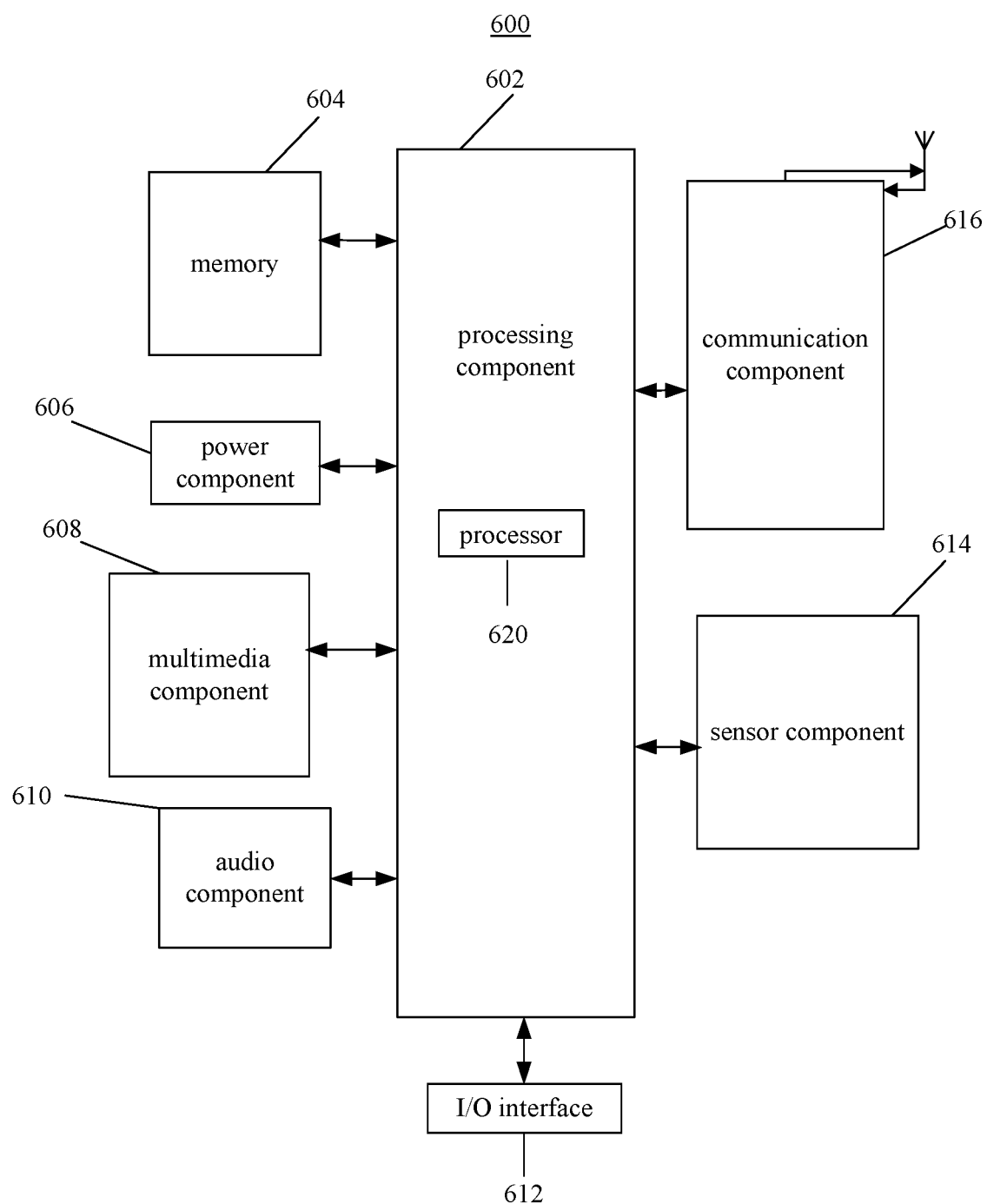
FIG. 6 is a block diagram of a device, according to an exemplary embodiment.

FIG. 6 is a block diagram of a device 600, according to an exemplary embodiment. For example, the device 600 may be a mobile phone, a computer, a digital broadcast terminal, a messaging device, a gaming console, a tablet, a medical device, exercise equipment, a personal digital assistant or the like.

Referring to FIG. 6, the device 600 may include one or more of the following components: a processing component 602, a memory 604, a power component 606, a multimedia component 608, an audio component 610, an Input/Output (I/O) interface 612, a sensor component 614, and a communication component 616.

The processing component 602 typically controls overall operations of the device 600, such as the operations associated with display, telephone calls, data communications, camera operations, and recording operations. The processing component 602 may include one or more processors 618 to execute instructions to perform all or part of the steps in the abovementioned method. Moreover, the processing component 602 may include one or more modules which facilitate interaction between the processing component 602 and the other components. For instance, the processing component 602 may include a multimedia module to facilitate interaction between the multimedia component 608 and the processing component 602.

The memory 604 is configured to store various types of data to support the operation of the device 600. Examples of such data include instructions for any application programs or methods operated on the device 600, contact data, phonebook data, messages, pictures, video, etc. The memory 604 may be implemented by any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk.

The power component 606 provides power for various components of the device 600. The power component 606 may include a power management system, one or more power supplies, and other components associated with the generation, management and distribution of power for the device 600.

The multimedia component 608 includes a screen providing an output interface between the device 600 and a user. In some embodiments, the screen may include a Liquid Crystal Display (LCD) and a Touch Panel (TP). If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action, but also sense a duration and pressure associated with the touch or swipe action. In some embodiments, the multimedia component 608 includes a front camera and/or a rear camera. The front camera and/or the rear camera may receive external multimedia data when the device 600 is in an operation mode, such as a photographing mode or a video mode. Each of the front camera and the rear camera may be a fixed optical lens system or have focusing and optical zooming capabilities.

The audio component 610 is configured to output and/or input an audio signal. For example, the audio component 610 includes a Microphone (MIC), and the MIC is configured to receive an external audio signal when the device 600 is in the operation mode, such as a call mode, a recording mode and a voice recognition mode. The received audio signal may be further stored in the memory 604 or sent through the communication component 616. In some embodiments, the audio component 610 further includes a speaker configured to output the audio signal.

The I/O interface 612 provides an interface between the processing component 602 and a peripheral interface module, and the peripheral interface module may be a keyboard, a click wheel, a button or the like. The button may include, but not limited to: a home button, a volume button, a starting button and a locking button.

The sensor component 614 includes one or more sensors configured to provide status assessment in various aspects for the device 600. For instance, the sensor component 614 may detect an on/off status of the device 600 and relative positioning of components, such as a display and small keyboard of the device 600, and the sensor component 614 may further detect a change in a position of the device 600 or a component of the device 600, presence or absence of contact between the user and the device 600, orientation or acceleration/deceleration of the device 600 and a change in temperature of the device 600. The sensor component 614 may include a proximity sensor configured to detect presence of an object nearby without any physical contact. The sensor component 614 may also include a light sensor, such as a Complementary Metal Oxide Semiconductor (CMOS) or Charge Coupled Device (CCD) image sensor, configured for use in an imaging application. In some embodiments, the sensor component 614 may also include an acceleration sensor, a gyroscope sensor, a magnetic sensor, a pressure sensor or a temperature sensor.

The communication component 616 is configured to facilitate wired or wireless communication between the device 600 and another device. The device 600 may access a communication-standard-based wireless network, such as a Wireless Fidelity (Wi-Fi) network, a 2nd-Generation (2G) or 3rd-Generation (3G) network or a combination thereof. In an exemplary embodiment, the communication component 616 receives a broadcast signal or broadcast associated information from an external broadcast management system through a broadcast channel. In an exemplary embodiment, the communication component 616 further includes a Near Field Communication (NFC) module to facilitate short-range communication. For example, the NFC module may be implemented on the basis of a Radio Frequency Identification (RFID) technology, an Infrared Data Association (IrDA) technology, an Ultra-WideBand (UWB) technology, a BlueTooth (BT) technology and another technology.

In an exemplary embodiment, the device 600 may be implemented by one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors or other electronic components, and is configured to execute the abovementioned methods.

In an exemplary embodiment, there is also provided a non-transitory computer-readable storage medium including instructions, such as the memory 604 including instructions. The instructions may be executed by the processor 620 of the device 600 to implement the abovementioned methods. For example, the non-transitory computer-readable storage medium may be a ROM, a Random Access Memory (RAM), a Compact Disc Read-Only Memory (CD-ROM), a magnetic tape, a floppy disc, an optical data storage device or the like.

According to a non-transitory computer-readable storage medium, the instructions in the storage medium are executed by the processor of the device 600 to enable the device 600 to execute the following method:

a touch operation acting on a touch key is acquired;

an operation type corresponding to the touch operation is determined; and an operation corresponding to the operation type is executed.

In an example, the step that the operation type corresponding to the touch operation is determined includes that:

a pressure value of the touch operation is acquired through a pressure sensor;

it is judged whether the pressure value meets a preset threshold value interval or not, the preset threshold value interval including a preset light touch threshold value interval and a preset pressing threshold value interval;

it is determined that the operation type corresponding to the touch operation is a light touch operation if the pressure value meets the preset light touch threshold value interval; and it is determined that the operation type corresponding to the touch operation is a pressing operation if the pressure value meets the preset pressing threshold value interval.

In an embodiment, the method further includes that:

it is determined that the operation type corresponding to the touch operation is a double-click operation if another touch operation meeting a preset condition is acquired within a preset time length when the operation type is the light touch operation, wherein the preset condition refers to that the touch operation acts on the touch key and a corresponding operation type is also the light touch operation.

In an embodiment, the step that the operation corresponding to the operation type is executed includes one of the following: executing a returning operation to return from a current page to a previous page when the operation type is the light touch operation; executing a quitting operation to return from the current page to a desktop menu page when the operation type is the pressing operation; executing a switching operation to switch from a current task to a target task when the operation type is the double-click operation.

In another example, the step that the operation type corresponding to the touch operation is determined includes that: a pressure value of the touch operation is acquired through the pressure sensor; it is judged whether the pressure value meets a preset pressing threshold value interval or not, the preset pressing threshold value interval including a preset light pressing threshold value interval and a preset heavy pressing threshold value interval; it is determined that the operation type corresponding to the touch operation is a light pressing operation if the pressure value meets the preset light pressing threshold value interval; and it is determined that the operation type corresponding to the touch operation is a heavy pressing operation if the pressure value meets the preset heavy pressing threshold value interval.

In an embodiment, the step that the operation corresponding to the operation type is executed includes that: a first operation is executed when the operation type is the light pressing operation; and a second operation is executed when the operation type is a heavy pressing operation, wherein the first operation is different from the second operation.

In an embodiment, when the terminal includes a vibration feedback component electrically connected with the processing chip, the method further includes that: a vibration characteristic of the vibration feedback component is determined by a processing chip according to the pressure value of the touch operation detected by the pressure sensor; and the vibration feedback component is controlled to vibrate according to the vibration characteristic.

In an embodiment, when the terminal includes a fingerprint identification sensor electrically connected with the processing chip, the method further includes that: a fingerprint image is acquired for identity authentication through the fingerprint identification sensor.

In addition, the device 600 may further execute the other steps involved in the method embodiments.

It should be understood that the term "multiple" mentioned in the present disclosure refers to two or more than two. The wording "and/or" describes an association relationship between associated objects, and represents that there may exist three relationships. For example, A and/or B may represent three conditions in which A independently exists, A and B both exist and B independently exists. The symbol "/" usually represents that the associated objects form an "or" relationship.

Other embodiments of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A terminal, comprising:
    a screen cover plate comprising a display area part and a key area portion, a touch key being formed in the key area portion;
    a touch sensor arranged below the touch key and configured to detect and identify a touch operation, wherein the touch operation comprises light touch, double click and long pressing;
    a pressure sensor arranged below the touch key and configured to detect and identify a pressure touch operation;
    a processing chip electrically connected with the touch sensor and the pressure sensor respectively;
    a vibration feedback component arranged below the touch key and electrically connected with the processing chip; and
    a fingerprint identification sensor arranged below the touch key;
    wherein the touch sensor, the fingerprint identification sensor, the pressure sensor and the vibration feedback component are sequentially arranged below the touch key and overlap with each other, and the fingerprint identification sensor is arranged between the touch sensor and the pressure sensor;
    wherein the processing chip is configured to determine a vibration characteristic of the vibration feedback component according to a pressure value detected by the pressure sensor, and to control the vibration feedback component to vibrate according to the vibration characteristic;
    wherein different pressure values correspond to different vibration characteristics;
    wherein the processing chip is further configured to determine that an operation type corresponding to the touch operation is a double-click operation if another touch operation meeting a preset condition is acquired within a preset time length when the operation type is the light touch operation, and the preset condition refers to that the touch operation acts on the touch key and the operation type thereof is also the light touch operation.

2. The terminal according to claim 1, wherein the processing chip determines an operation type corresponding to a touch operation according to the touch operation acting on the touch key and executes the operation corresponding to the operation type.

3. The terminal according to claim 1, wherein the pressure sensor comprises:
    a first electrode layer and a second electrode layer respectively arranged at upper and lower layers; and
    wherein the screen cover plate is deformed under the pressure to cause a change in a distance or contact area between the first electrode layer and the second electrode layer.

4. A touch response method, applied to a terminal comprising:
    a touch key;
    a touch sensor arranged below the touch key and configured to detect and identify a touch operation, wherein the touch operation comprises light touch, double click and long pressing;

a pressure sensor arranged below the touch key and configured to detect and identify a pressure touch operation;

a processing chip electrically connected with the touch sensor and the pressure sensor respectively;

a vibration feedback component arranged below the touch key and electrically connected with the processing chip; and a fingerprint identification sensor arranged below the touch key;

wherein the touch sensor, the fingerprint identification sensor, the pressure sensor and the vibration feedback component are sequentially arranged below the touch key and overlap with each other, and the fingerprint identification sensor is arranged between the touch sensor and the pressure sensor;

the method comprising:

acquiring a touch operation acting on the touch key;

determining, by the processing chip, an operation type corresponding to the touch operation, which comprises:

determining that the operation type corresponding to the touch operation is a double-click operation if another touch operation meeting a preset condition is acquired within a preset time length when the operation type is the light touch operation, and the preset condition refers to that the touch operation acts on the touch key and the operation type thereof is also the light touch operation; and executing an operation corresponding to the operation type;

wherein the method further comprises:

determining, by the processing chip, a vibration characteristic of the vibration feedback component according to a pressure value of the touch operation detected by the pressure sensor; and controlling the vibration feedback component to vibrate according to the vibration characteristic;

wherein different pressure values correspond to different vibration characteristics.

5. The method according to claim 4, wherein determining, by the processing chip, the operation type corresponding to the touch operation comprises:

acquiring, by the processing chip, the pressure value of the touch operation through the pressure sensor of the terminal;

judging whether the pressure value meets a preset threshold value interval or not, the preset threshold value interval comprising a preset light touch threshold value interval and a preset pressing threshold value interval;

determining that the operation type corresponding to the touch operation is a light touch operation if the pressure value meets the preset light touch threshold value interval; and determining that the operation type corresponding to the touch operation is a pressing operation if the pressure value meets the preset pressing threshold value interval.

6. The method according to claim 5, wherein executing the operation corresponding to the operation type comprises:

executing a returning operation to return from a current page to a previous page when the operation type is the light touch operation;

executing a quitting operation to return from the current page to a desktop menu page when the operation type is the pressing operation;

executing a switching operation to switch from a current task to a target task when the operation type is the double-click operation.

7. The method according to claim 4, wherein determining, by the processing chip, the operation type corresponding to the touch operation comprises:

acquiring, by the processing chip, the pressure value of the touch operation through the pressure sensor;

judging whether the pressure value meets a preset pressing threshold value interval or not, the preset pressing threshold value interval comprising a preset light pressing threshold value interval and a preset heavy pressing threshold value interval;

determining that the operation type corresponding to the touch operation is a light pressing operation if the pressure value meets the preset light pressing threshold value interval; and determining that the operation type corresponding to the touch operation is a heavy pressing operation if the pressure value meets the preset heavy pressing threshold value interval.

8. The method according to claim 7, wherein executing the operation corresponding to the operation type comprises:

executing a first operation when the operation type is the light pressing operation; and executing a second operation when the operation type is a heavy pressing operation, wherein the first operation is different from the second operation.

9. The method according to claim 4, wherein the method further comprises:

acquiring a fingerprint image for identity authentication through the fingerprint identification sensor.

10. A touch response device, applied to a terminal comprising a touch key;

a touch sensor arranged below the touch key and configured to detect and identify a touch operation, wherein the touch operation comprises light touch, double click and long pressing;

a pressure sensor arranged below the touch key and configured to detect and identify a pressure touch operation;

a vibration feedback component arranged below the touch key and electrically connected with a processor, and a fingerprint identification sensor arranged below the touch key;

wherein the touch sensor, the fingerprint identification sensor, the pressure sensor and the vibration feedback component are sequentially arranged below the touch key and overlap with each other, and the fingerprint identification sensor is arranged between the touch sensor and the pressure sensor;

the device comprising:

the processor; and a memory configured to store instructions executable by the processor, wherein the processor is configured to:

acquire a touch operation acting on the touch key;

determine an operation type corresponding to the touch operation; and execute an operation corresponding to the operation type;

wherein the processor is further configured to:

determine a vibration characteristic of the vibration feedback component according to a pressure value of the touch operation detected by the pressure sensor; and control the vibration feedback component to vibrate according to the vibration characteristic;

wherein different pressure values correspond to different vibration characteristics;

wherein the processor is further configured to:

determine that the operation type corresponding to the touch operation is a double-click operation if another touch operation meeting a preset condition is acquired within a preset time length when the operation type is the light touch operation; and wherein the preset condition refers to that the touch operation acts on the touch key and the operation type thereof is also the light touch operation.

11. The device according to claim 10, wherein the processor configured to determine the operation type corresponding to the touch operation is further configured to:

acquire the pressure value of the touch operation through the pressure sensor of the terminal;

judge whether the pressure value meets a preset threshold value interval or not, the preset threshold value interval comprising a preset light touch threshold value interval and a preset pressing threshold value interval;

determine that the operation type corresponding to the touch operation is a light touch operation if the pressure value meets the preset light touch threshold value interval; and determine that the operation type corresponding to the touch operation is a pressing operation if the pressure value meets the preset pressing threshold value interval.

12. The device according to claim 11, wherein the processor configured to execute the operation corresponding to the operation type is further configured to:

execute a returning operation to return from a current page to a previous page when the operation type is the light touch operation;

execute a quitting operation to return from the current page to a desktop menu page when the operation type is the pressing operation;

execute a switching operation to switch from a current task to a target task when the operation type is the double-click operation.

13. The device according to claim 10, wherein the processor configured to determine the operation type corresponding to the touch operation is further configured to:

acquire the pressure value of the touch operation through the pressure sensor;

judge whether the pressure value meets a preset pressing threshold value interval or not, the preset pressing threshold value interval comprising a preset light pressing threshold value interval and a preset heavy pressing threshold value interval;

determine that the operation type corresponding to the touch operation is a light pressing operation if the pressure value meets the preset light pressing threshold value interval; and determine that the operation type corresponding to the touch operation is a heavy pressing operation if the pressure value meets the preset heavy pressing threshold value interval.

14. The device according to claim 13, wherein the processor configured to execute the operation corresponding to the operation type is further configured to:

execute a first operation when the operation type is the light pressing operation; and execute a second operation when the operation type is a heavy pressing operation, wherein the first operation is different from the second operation.

* * * * *